(12) United States Patent
Bertelsen et al.

(10) Patent No.: US 7,673,970 B2
(45) Date of Patent: Mar. 9, 2010

(54) FLEXIBLE CIRCUIT CORROSION PROTECTION

(75) Inventors: Craig M. Bertelsen, Union, KY (US); Sean T. Weaver, Union, KY (US)

(73) Assignee: Lexmark International, Inc., Lexington, KY (US)

( * ) Notice: Subject to any disclaimer, the term of this patent is extended or adjusted under 35 U.S.C. 154(b) by 1010 days.

(21) Appl. No.: 10/882,728

(22) Filed: Jun. 30, 2004

(65) Prior Publication Data

US 2006/0001700 A1    Jan. 5, 2006

(51) Int. Cl.
*B41J 2/14*    (2006.01)
(52) U.S. Cl. .......................................... 347/50
(58) Field of Classification Search ............ 347/50, 347/86, 87
See application file for complete search history.

(56) References Cited

U.S. PATENT DOCUMENTS

| | | | |
|---|---|---|---|
| 4,503,133 A | 3/1985 | van Lier et al. | |
| 4,588,641 A | 5/1986 | Haque et al. | |
| 4,639,285 A | 1/1987 | Suzuki et al. | |
| 4,683,481 A * | 7/1987 | Johnson | 347/65 |
| 4,686,544 A | 8/1987 | Ikeda et al. | |
| 4,938,995 A | 7/1990 | Giordano et al. | |
| 5,017,946 A | 5/1991 | Masuda et al. | |
| 5,442,386 A * | 8/1995 | Childers et al. | 347/50 |
| 5,538,586 A | 7/1996 | Swanson et al. | |
| 5,770,271 A | 6/1998 | Imamura | |
| 6,156,435 A | 12/2000 | Gleason et al. | |
| 6,242,054 B1 | 6/2001 | Baalmann et al. | |
| 6,283,578 B1 | 9/2001 | Popall et al. | |
| 6,290,331 B1 * | 9/2001 | Agarwal et al. | 347/47 |
| 6,325,488 B1 * | 12/2001 | Beerling et al. | 347/42 |
| 6,472,129 B2 | 10/2002 | Noguchi et al. | |
| 6,489,557 B2 | 12/2002 | Eskildsen et al. | |
| 6,497,923 B2 | 12/2002 | Baalmann et al. | |
| 6,655,022 B1 | 12/2003 | Eskildsen et al. | |
| 2002/0134580 A1 | 9/2002 | Hedler et al. | |
| 2002/0135636 A1 | 9/2002 | Miyakawa et al. | |
| 2004/0041883 A1 | 3/2004 | Eida et al. | |

FOREIGN PATENT DOCUMENTS

JP        03227010 A  * 10/1991

* cited by examiner

*Primary Examiner*—An H Do

(57) ABSTRACT

A flexible circuit having improved corrosion resistance and method therefor. The flexible circuit includes, a polymeric support substrate, a conductive layer providing tracing attached to a first surface of the support substrate, and lead beams in electrical communication with the tracing for attaching the flexible circuit to a micro-fluid ejection head. A plasma polymerized layer is deposited on at least a portion of the conductive layer to reduce corrosion of the conductive layer. The plasma polymerized layer may also improve adhesion between the flexible circuit and an adhesive use to attach the flexible circuit to a structure.

24 Claims, 4 Drawing Sheets

FLEXIBLE CIRCUIT CORROSION PROTECTION

FIELD OF THE DISCLOSURE

The disclosure relates to improved flexible circuits for electronic devices and in particular to improved flexible circuits for use on micro-fluid ejection devices.

BACKGROUND

Micro-fluid ejection devices, such as ink jet printers, typically have fluid ejection cartridges constructed with flexible circuits or tape automated bonding (TAB) circuits for connecting ejection devices on ejection heads attached to the cartridges with an ejection control device such as a printer. Many fluids ejected by the ejection heads exhibit corrosive properties toward metals used as tracing or conductors on the heads and flexible or TAB circuits. Accordingly, during the fabrication of such ejection heads, a protective material is applied to the circuits, tracing, and lead beams to reduce corrosion. For example, a gold coating may be applied to lead beams used for attaching the flexible circuit to the ejection head to reduce corrosion of the lead beams.

Flexible circuits are also made with a covercoat or protective layer coated over the metal conductors or tracing to prevent contact between the tracing and fluids in the ejection head. A typical covercoat layer is provided by an epoxy or acrylate material that is screen printed onto the flexible circuit. Unfortunately, such material is often brittle, or may be easily damaged during handling. Due to its brittleness, the epoxy or acrylate covercoat material may develop minute cracks during manufacturing of parts containing the flexible circuit, which increase the susceptibility of corrosion of the circuitry and delamination of flexible circuit from an attached surface. The cracks may allow the fluid ejected by the ejection head to come in contact with the tracing or conductors thereby corroding or otherwise affecting the current carrying capabilities of one or more of the conductors. Encapsulation of the conductors, tracing, and lead beams on the fluid cartridges using has not been a totally satisfactory solution.

One of the main paths for corrosion to occur is ink migration under an encapsulant material for a semiconductor substrate via delamination of the bond between the encapsulant material and a nozzle plate attached to the semiconductor substrate. Once a corrosion fluid such as ink gets between the encapsulant material and the nozzle plate, the fluid can corrode the lead beams of the flexible circuit creating an electrical short therein.

Hence, there continues to be a need for improved flexible circuits for micro-fluid ejection heads that exhibit increased resistance to corrosion.

SUMMARY

With regard to the foregoing and other objects and advantages there is provided a flexible circuit having improved corrosion resistance and method for making the flexible circuit. The flexible circuit includes, a polymeric support substrate, a conductive layer providing tracing attached to a first surface of the support substrate, and lead beams in electrical communication with the tracing for attaching the flexible circuit to a micro-fluid ejection head. A plasma polymerized layer is deposited on at least a portion of the conductive layer to reduce corrosion of the conductive layer.

In another embodiment there is provided a micro-fluid ejection device structure including a fluid supply body containing an ejection head pocket. An ejection head is adhesively attached in the ejection head pocket of the supply body. The ejection head contains a plurality of fluid ejection actuators. A flexible circuit member is electrically connected to the ejection head and adhesively attached to the fluid supply body. The flexible circuit includes a polymeric support substrate, a conductive layer providing tracing attached to a first surface of the support substrate, lead beams in electrical communication with the tracing for attaching the flexible circuit to a micro-fluid ejection head. A plasma polymerized layer is deposited on at least a portion of the conductive layer to reduce corrosion of the conductive layer.

Another embodiment provides a method for improving corrosion resistance of a flexible circuit structure. The method includes providing a flexible circuit including a polymeric substrate having first and second surface and a conductive layer patterned and developed on the first surface of the substrate. A material is plasma polymerized onto at least the first surface and conductive layer of the flexible circuit to effectively coat the conductive layer with a corrosion resistant material derived from a monomer selected from the group consisting of polymerizable sulfur containing monomers, polymerizable fluorocarbon monomers, polymerizable hydrocarbon monomers, polymerizable silicon containing monomers, and mixtures of two or more of the foregoing.

An advantage of embodiments described herein can be that flexible circuits are provided containing devices that have improved corrosion resistance, particularly for devices such as micro-fluid ejection devices which may contain fluids that can corrode sensitive electrical conductors on the circuits. Another advantage of embodiments described herein can be that the plasma polymerized coating may increase or promote adhesion between an adhesive and the flexible circuit for attaching the flexible circuit to a body. Another advantage associated with certain embodiment of the present invention can be that the polymerized coating material may be effective to reduce corrosion of lead beams for the flexible circuit, thereby eliminating the need to coat the lead beams with a corrosion resistant conductive material such as gold.

BRIEF DESCRIPTION OF THE DRAWINGS

Further advantages of the disclosed embodiments will become apparent by reference to the detailed description of exemplary embodiments when considered in conjunction with the following drawings illustrating one or more non-limiting aspects of the embodiments, wherein like reference characters designate like or similar elements throughout the several drawings as follows.

DETAILED DESCRIPTION OF THE EMBODIMENTS

Figure 1:
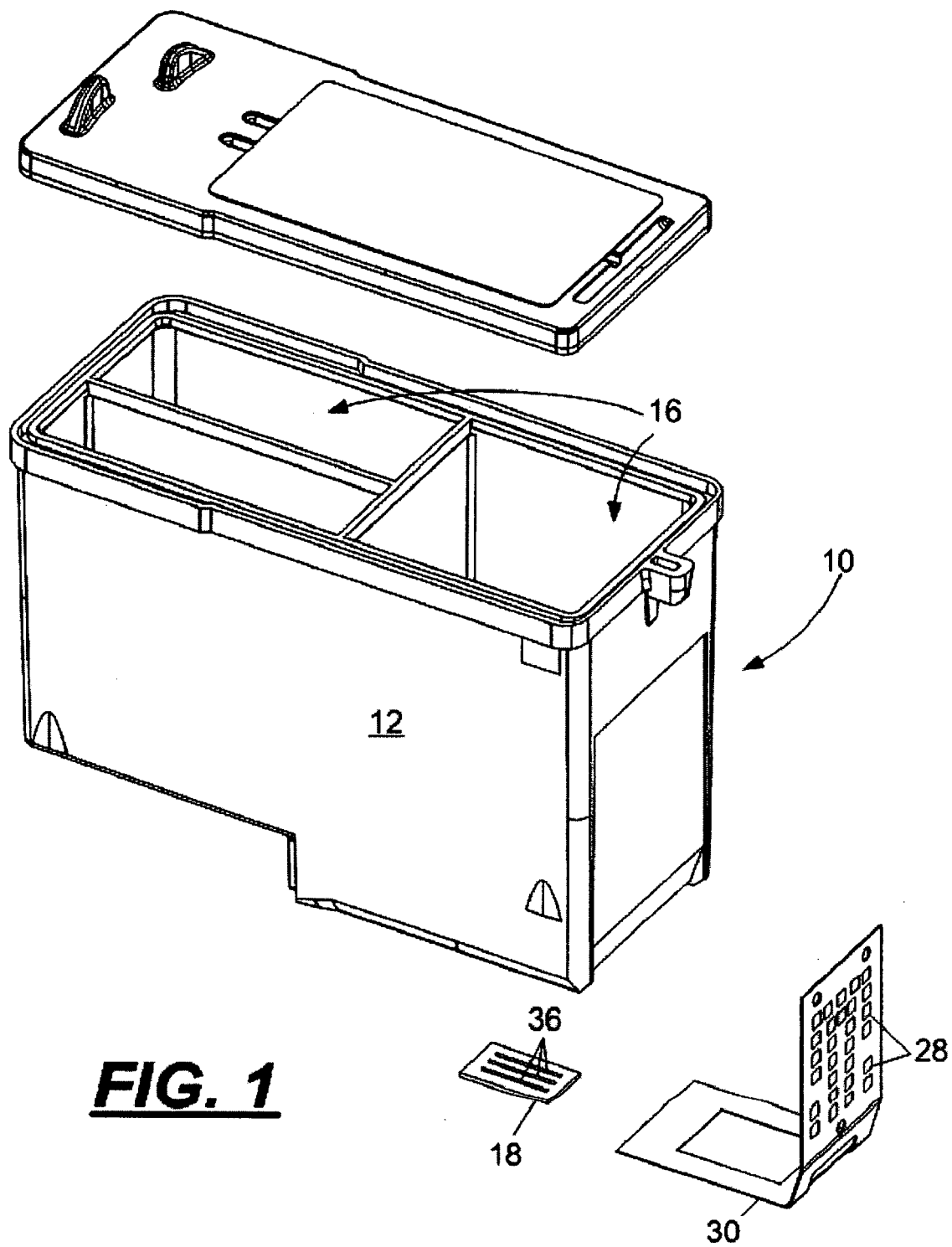
FIG. 1 is a perspective view, not to scale, of a micro-fluid ejection device structure containing a flexible circuit component.

For the purpose of the disclosure, the term "flexible circuit" is used in its broadest sense and includes any conductive circuitry attached to, deposited on, or imbedded in a relatively thin film polymeric material, including but not limited to, tape automated bonding (TAB) circuits, and the like.

In one aspect, the disclosure provides improved corrosion resistance of the lead beams and circuitry of the flexible circuit by depositing a corrosion resistant, adhesion promoting polymeric coating on the lead beams and the flexible circuit a via plasma polymerization process. A plasma polymerized coating may not only reduce corrosion problems, but may also eliminate the need for the covercoat layer on the underside of the flexible circuit, and may provide a suitable replacement for a gold coating that is applied to the lead beams to protect the lead beams from corrosion. Elimination of the covercoat layer and replacement of a gold coating on the lead beams is expected to provide a cost reduction and improve the longevity of a micro-fluid ejection head containing such flexible circuit.

As set forth above, a protective coating or layer is provided on the flexible circuit and leads beams by a plasma polymerization process. Plasma polymerization is a technique in which a thin uniform polymer film is deposited onto a surface. In this type of deposition process, an ionized gas (plasma) is used to deposit a polymer film, which is formed through chemical reaction of a reactant gas, electrons, and neutral species in the plasma. In a plasma deposition process, the reactant gas (monomer) is broken down through collisions with molecules and excited species (ions, etc) and then recombined through free radical reactions on a substrate surface. The process allows the polymerization and deposition of all types of monomers, even those that would normally not polymerize in a liquid state such as alkanes or benzenes. Plasma polymerized films according to the disclosure include films derived from or containing silicon, fluorocarbons, and a combination thereof.

According to the disclosure, a plasma polymer is deposited onto the plasma-treated surface, preferably under further reducing conditions at first. The main component of this plasma polymer is a hydrocarbon, fluorocarbon, and/or an organosilicon compound, which can contain oxygen, nitrogen, or sulfur atoms, whereby said hydrocarbon or organosilicon compound has a boiling point such that it can be vaporized under the temperature and pressure conditions prevailing in the plasma coating chamber. Substances that are suitable are primarily alkanes, alkenes, aromatic hydrocarbons, silanes, siloxanes, silazanes, and silathianes, preferably siloxanes.

Exemplary fluorocarbon monomers include heptafluorobutanol, pentafluorodimethyl ether, perfluoropropylene oxide, bis (trifluoromethyl) peroxide, heptafluorobutyric anhydride, x-hydroperfluoroisobutyric acid, (perfluoropropenyl-2) acetate and trifluoroacetaldehyde.

Silicon containing materials include, but are not limited to, hexamethyldisilazane, hexamethyldisiloxane, tetraetoxysilane, hexamethylcyclotrisilazane, and hexamethyldisilathiane. It is also possible to use higher homologs of these compounds and mixtures of such compounds, or their partially or completely fluorinated derivatives. Hydrocarbons, especially olefins, e.g. ethylene, propene, and cyclohexene, can serve as co-monomers for the formation of plasma polymers from organosilicon monomers. Sulfur containing molecules such as sulfur hexafluoride, mercaptosilanes, bensozthiazoles, and sulfenated hydrocarbons such as mercaptobutanol could also be used as co-monomers for the above plasma polymers.

Other materials useful for providing plasma polymerized layers include, but are not limited to, various organic monomers such as thiourea, thioacetamide, vinyl ferrocene, 1,3,5-trichlorobenzene, chlorobenzene, styrene, ferrocene, pyroline, naphthalene, pentamethylbenzene, nitrotoluene, acrylonitrile, diphenyl selenide, p-toluidine, p-xylene, N,N-dimethyl-p-toluidine, toluene, aniline, hexamethylbenzene, malononitrile, tetracyanoethylene, thiophene, benzeneselenol, tetrafluoroethylene, ethylene, N-nitrosodiphenylamine, acetylene, 1,2,4-trichlorobenzene, propane and the like.

By using a plasma polymerized coating derived from one or more of the foregoing materials, corrosion of the flexible circuit and lead beams may be prevented or minimized. Furthermore, since the plasma polymerized layer is on one or more of the exterior surfaces of the flexible circuit and lead beams, the plasma polymerized layer promotes adhesion between an encapsulant material and the lead beams. Increased adhesion between the lead beams and the encapsulant material makes it harder for a corrosive fluid to penetrate an encapsulant material and corrode the lead beams.

The plasma polymerized layer also acts as a barrier layer for the lead beams instead of gold. By acting as barrier layer for the lead beams, corrosive fluids that do penetrate between the encapsulant material and lead beams will still have to penetrate the plasma polymerized layer coating in order to corrode the lead beams.

As described in more detail below, the plasma polymerized layer may also be applied to an exterior surface of the flexible circuit to act as a covercoat layer and to promote adhesion between the flexible circuit and an adhesive used to attach the flexible circuit to a surface. It is well known that polyimides used to make flexible circuits are difficult to adhere to surfaces due to their robust chemical nature. By using a plasma process, the exterior surface of the flexible circuit may be made more reactive for promoting adhesion between the flexible circuit and an adhesive. Adhesion promotion is a significant benefit of the plasma polymerized coating compared to currently used covercoat layers on the flexible circuits which are poorly adhered to the polyimide material of the flexible circuit.

Another benefit of embodiments of the disclosure is that the plasma polymerized films have exceptional flexibility compared to conventional covercoat materials. Since the plasma polymerized layers are applied to both the lead beams and an adhesive surface side of the flexible circuit, the plasma polymerized layers are much more cost effective process than using a screen printed covercoat layer on the adhesive surface side of the flexible circuit and a gold coating on the leads beams thereto. The same plasma polymerized layer is used on the lead beams and as a covercoat layer and thus may be applied to the flexible circuit at the same time rather than in two or more separate steps. Therefore both the lead beams and the underside of the tab circuit would be coated at the same time in a one step process.

Since the plasma polymerized layer on the flexible circuit has a greater affinity for adhesives, the flexible circuit may be directly attached to a pressure sensitive adhesive layer on a surface without additional process steps. Hence, a flexible circuit made according to the disclosure may be directly inserted into a manufacturing process with minimal impact on the manufacturing process.

These coatings may also alleviate the need for high cost coatings, such as the gold coating that is used as corrosion protection on the tab circuit and lead beams. In order to take advantage of this, the coating could be deposited in line with the tab circuit construction or after an etch to remove any copper oxidation that had formed.

With reference to FIG. 1, a fluid cartridge 10 for a micro-fluid ejecting device is illustrated. The cartridge 10 includes a cartridge body 12 for supplying a fluid to a fluid ejection head 14. The fluid may be contained in a storage area 16 in the cartridge body 12 or may be supplied from a remote source to the cartridge body 12.

Figure 2:
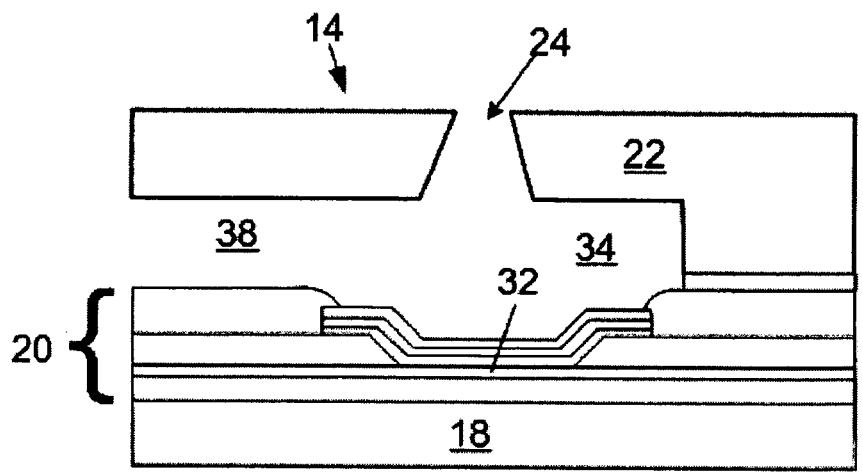
FIG. 2 is a cross-sectional view, not to scale, of a portion of an ejection head for a micro-fluid ejection device structure.
Figure 3:
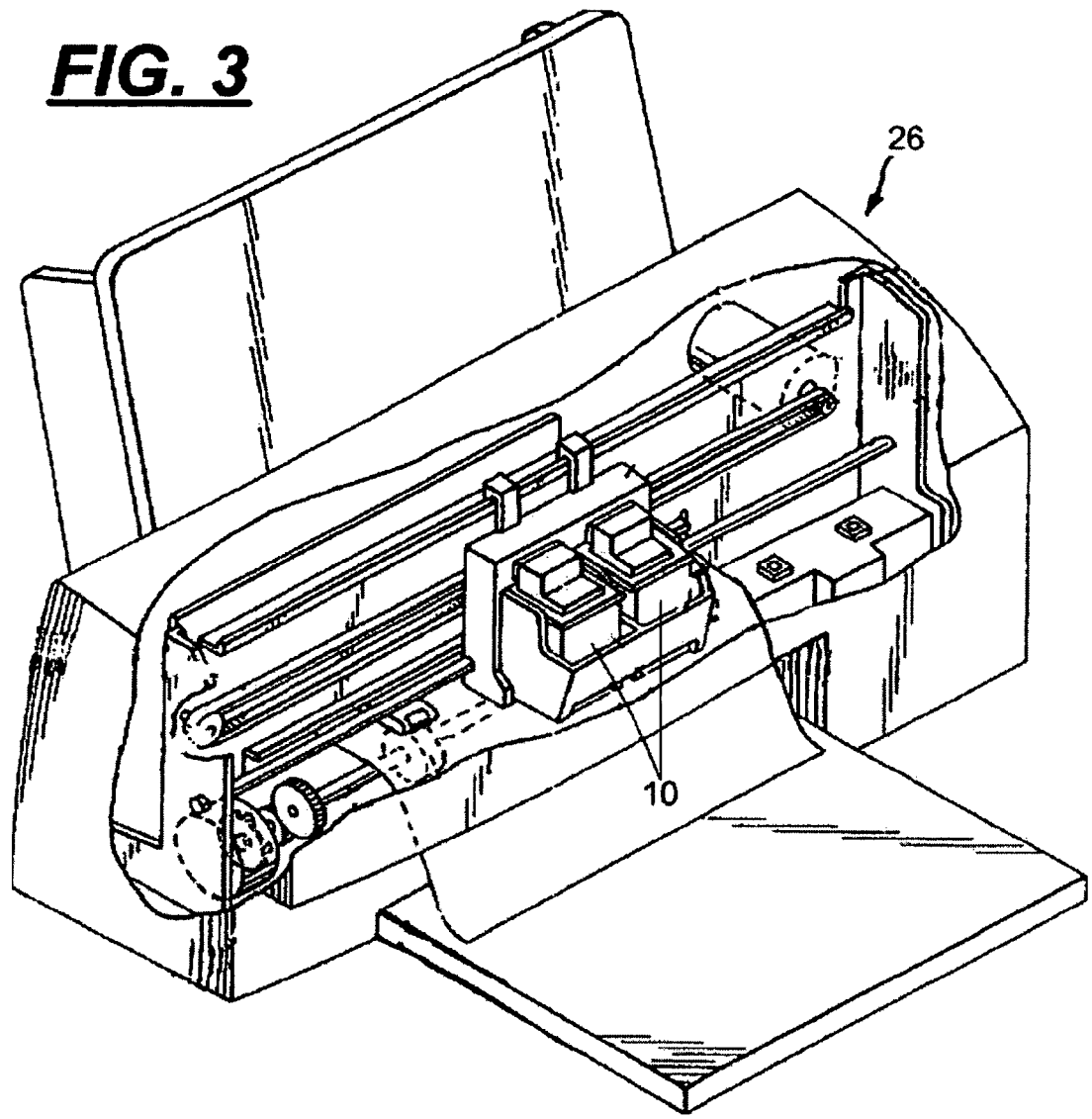
FIG. 3 is a perspective view of an ink jet printer.

With reference to FIG. 2, there is shown an enlarged view of a portion of the micro-fluid ejection head 14. The fluid ejection head 14 includes a semiconductor substrate 18 containing a plurality of insulating, conducting, and passivating or dielectric layers 20, and a nozzle plate 22 containing nozzle holes 24 attached to the substrate/layers 18/20. The cartridge or cartridges 10 can be removably attached to a fluid ejection device such as an ink jet printer 26 FIG. 3. Accordingly, electrical contacts 28 are provided on a flexible circuit 30 (FIG. 1) for electrical connection to the fluid ejection device 26.

In the embodiment illustrated in FIG. 2, the fluid ejection head 14 contains a thermal heating element 32 for heating the fluid in a fluid chamber 34 formed in the nozzle plate 22 between the substrate/layers 18/20 and the nozzle hole 24. However, the disclosure is not limited to a fluid ejection head 14 containing a thermal heating element 32. Other fluid ejection devices, such as piezoelectric devices may also be used to provide a fluid ejection head according to the disclosure.

Fluid is provided to the fluid chamber 34 through one or more openings or slots 36 (FIG. 1) in the semiconductor substrate 18 and through a fluid channel 38 connecting the slots 36 with the fluid chamber 34. The nozzle plate 22 can be adhesively attached to the substrate/layers 18/20 as by an adhesive. The fluid may be an ink for ejection by a thermal or piezoelectric ink jet printhead, or other fluid for ejection by a micro-fluid ejection head 14.

Figure 5:
FIG. 5 is a cross-sectional view, not to scale, of a portion of a prior art flexible circuit.
Figure 4:
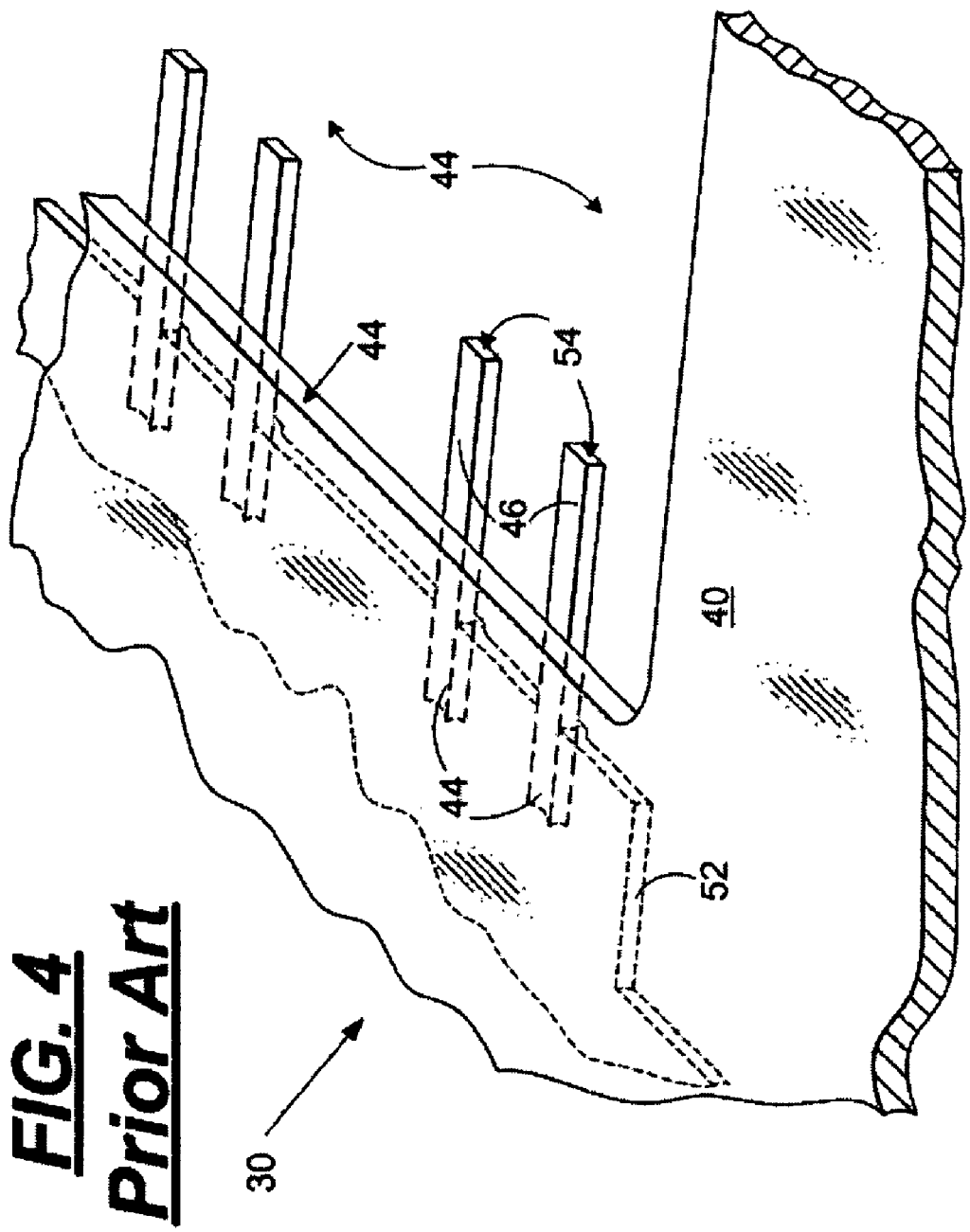
FIG. 4 is a perspective view, not to scale, of a portion of a prior art flexible circuit.

With reference now to FIGS. 4 and 5, a prior art flexible circuit 30 is illustrated in more detail. The flexible circuit 30 includes a polymeric film 40 having deposited and developed thereon a conductive layer 42 providing a plurality of conductive traces 44. The polymeric film 40 is typically a polyimide material, as polyimide suitably resists many corrosive fluids. The conductive layer 42 may be made of any suitable metal, including, but not limited to, gold, silver, copper, aluminum, and alloys thereof.

The conductive traces 44 terminate in lead beams 46 (FIG. 4) that are connected to the substrate/layers 18/20 of the fluid ejection head 14. The lead beams 46 extend past an end or edge 48 into a window 50 or open area of the flexible circuit 30 to provide for electrical connection to a device such as the micro-fluid ejection head 14 described above. A covercoat layer 52 is applied, as by screen printing, to the conductive layer 42 and polymeric film 40 to prevent contact of corrosive fluids with the conductive traces 44. As described above, the covercoat layer 52 is less flexible than the polymeric film 40 and may develop cracks which can allow fluids to contact the conductive traces 44 thereby corroding the material. An exposed end 54 of the lead beams 46 may provide a site for chemical attack if the lead beams 46 are not coated with a corrosion resistant material such as gold.

Figure 6:
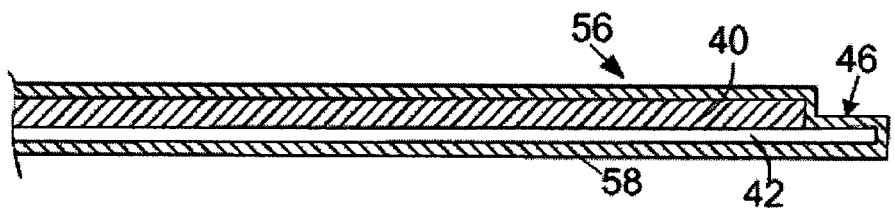
FIG. 6 is a cross-sectional view, not to scale, of a portion of a flexible circuit made according to one embodiment of the disclosure.

As described above, embodiments of the disclosure provide an improved flexible circuit 56 containing a plasma polymerized layer 58 is deposited on the flexible circuit 56 (FIG. 6) in place of the covercoat layer 52. The plasma polymerized layer 58 may be applied to one, or preferably both sides of the flexible circuit 56 as shown in FIG. 6. Accordingly, the plasma polymerized layer 58 may totally cover the lead beams 46 so that the gold coating of the lead beams 46 is not required for corrosion protection. In the alternative, the lead beams 46 may be taped or otherwise masked during the plasma polymerization process and a corrosion resistant material such as gold applied to the lead beams 46.

Figure 7:
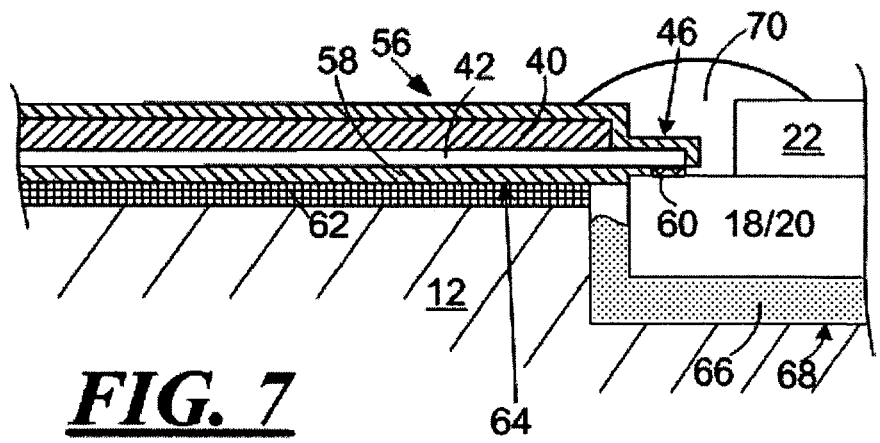
FIG. 7 is a cross-sectional view, not to scale, of a portion of an ejection head and flexible circuit attached to a fluid supply body.

FIG. 7 illustrates attachment of the flexible circuit 56 to a cartridge body 12 and semiconductor substrate/layers 18/20, as by connecting the lead beams 46 to bond pads 60 on the substrate/layers 18/20. An adhesive 62, used to attach the flexible circuit 56 to the cartridge body 12, is preferably a pressure sensitive adhesive 62. The plasma polymerized layer 58 on the underside 64 of the flexible circuit 56 is effective to promote adhesion of the flexible circuit 56 to the pressure sensitive adhesive 62.

FIG. 7 also illustrates a die bond adhesive 66 that attaches the semiconductor substrate/layers 18/20 to a recessed portion 68 of the cartridge body 12. An encapsulant material 70 is provided to further protect exposed portions of the lead beams 46 and bond pads 60 from fluids which may accumulate on the nozzle plate 22 during fluid ejection. Accordingly, adhesion of the encapsulant material 70 to the flexible circuit 56 is important in current embodiments to prevent fluids from attacking the conductive traces 44 and lead beams 46.

As set forth above, the plasma polymerized layer 58 may be effective to increase adhesion between the encapsulant material 70 and the flexible circuit 56. In order to provide optimal protection from corrosion, the plasma polymerized layer 58 may have a thickness ranging from about 100 nanometers to about 10 microns thick.

The plasma polymerized layer 58 described herein can be deposited by subjecting an organic material, in the gaseous state, to electromagnetic energy of an appropriate frequency and power such that a plasma of the gaseous medium is formed. The gaseous material is exposed to a plasma glow discharge which forms ion radicals and other electronically excited species which deposit on the surface of the flexible circuit 56 and are polymerized, yielding a thin film thereon. The electrical power input to the chamber may be between 1 kilowatt/m$^3$ and 3.5 kilowatts/m$^3$. It is also advantageous if the gas flow per chamber volume is set between about 20 sccm/m$^3$ and about 300 sccm/m$^3$.

An additional gas may be admixed with the working gas. The additional gas may be a noble gas, a halogen, in particular fluorine, oxygen, nitrogen or a mixture thereof, in order to modify the properties of the plasma and the plasma polymer.

Generally speaking, plasma polymerization takes place at a temperature ranging from about 60° to about 200° C., preferably less than or equal to about 100° C. The pressure in the plasma coating chamber is typically less than or equal to 10 millibars.

The presence of free radicals in the plasma polymerization process allows for cross-linking of monomer segments in such a manner that the resultant thin film is dense, and substantially continuous and pinhole-free or void-free. Thin film, derived from the precursor monomer containing fluorine and hydroxy groups next to or in close proximity to the carbon with an extractable hydrogen, will deposit at rates up to approximately 5,000 Angstroms/minute, depending on processing parameters. The dielectric constants exhibited by these oxygen-containing, high fluoropolymer thin films will range from about 2.3 to about 3.3.

Suitable systems for depositing a plasma polymerized thin film on a substrate such as a polyimide film, include, but are not limited to, a microwave plasma generator system, direct current system, audio frequency system, radio frequency (r.f.) system, or other conventional or commercially known power system. In r.f. plasma generation, two types of reactors that could be used would be inductively coupled or capacitively coupled reactors. An inductively coupled reactor involves a vacuum chamber enclosed by a coil which is connected to an electromagnetic energy plasma generator. Typical reactor chambers for inductively coupled reactors include glass tubes and glass bell jars. A capacitively coupled reactor typically involves a metal chamber (aluminum, steel) with parallel plates acting as the electrodes which are connected externally to the radiation source. Microwave systems typically are again metal chambers with an external microwave generator. The microwaves enter the reactor through a quartz porthole. The substrate to be coated is positioned within the tube or the electroses such that maximum thin film deposition occurs with uniformity of coverage. A first outlet into the reaction chamber allows for evacuation of the system, and two other outlets are connected to gas bleed systems, one for adding the organic monomer gas, and the other for an inert carrier gas, such as argon, helium, or other appropriate carrier gas.

In conducting a plasma polymerization process, typically the reaction chamber is first evacuated to about $10^{-3}$ to about $10^{-6}$ Torr to remove outside air or airborne contaminants in the reactor. The tube is then charged with an inert gas as a carrier gas, at various flow rates (reactor size dependent). Once the flow has reached equilibrium, electromagnetic energy at a frequency in the range of about 13.56 MHz (r.f.) to 3.5 GHz (microwave) is applied by the electromagnetic energy plasma generator at between 10-1000 watts of power. Then the reactor is charged with the monomer to be deposited on the substrate. Typical operating pressure is about $10^{-1}$ to $10^{-2}$ Torr. The applied electromagnetic energy initiates a glow discharge causing deposition of the plasma polymerized thin film.

It is contemplated, and will be apparent to those skilled in the art from the preceding description and the accompanying drawings, that modifications and changes may be made in the embodiments of the invention. Accordingly, it is expressly intended that the foregoing description and the accompanying drawings are illustrative of exemplary embodiments only, not limiting thereto, and that the true spirit and scope of the present invention be determined by reference to the appended claims.

What is claimed is:

1. A flexible circuit, comprising:
    a polymeric support substrate;
    a conductive layer providing tracing attached to a first surface of the support substrate;
    lead beams in electrical communication with the tracing for attaching the flexible circuit to a micro-fluid ejection head; and
    a plasma polymerized layer deposited on at least a portion of the conductive layer to reduce corrosion of the conductive layer.

2. The flexible circuit of claim 1, wherein the plasma polymerized layer comprises a material derived from a monomer selected from the group consisting of polymerizable fluorocarbon monomers, polymerizable hydrocarbon monomers, polymerizable silicon containing monomers, polymerizable sulfur containing monomers and mixtures of two or more of the foregoing.

3. The flexible circuit of claim 2, wherein the monomer is selected from the group consisting of hexamethyldisiloxane, tetraethoxysilane, hexamethyldisilazane, and mixtures of two or more of the foregoing.

4. The flexible circuit of claim 2, wherein the monomer is selected from the group consisting of carbon tetrafluoride, tetrafluoroethylene, hexafluoropropylene, heptafluorobutanol, pentafluorodimethyl ether, perfluoropropylene oxide, bis(trifluoromethyl)peroxide, heptafluorobutyric anhydride, x-hydroperfluoroisobutyric acid, (perfluoropropenyl-2)acetate, and trifluoroacetaldehyde.

5. The flexible circuit claim 2, wherein the monomer is selected from a group consisting of sulfur hexafluoride, mercaptosilanes, benzothiazoles, mercaptobutanol and mixtures of two or more of the foregoing.

6. The flexible circuit of claim 1, wherein the conductive layer is comprised of a metal selected from the group consisting of copper and aluminum.

7. A micro-fluid ejection head comprising the flexible circuit of claim 1.

8. A micro-fluid ejection device structure comprising:
    a fluid supply body containing an ejection head pocket;
    an ejection head adhesively attached in the ejection head pocket of the supply body, the ejection head containing a plurality of fluid ejection actuators; and
    a flexible circuit member electrically connected to the ejection head and adhesively attached to the fluid supply body, the flexible circuit including a polymeric support substrate, a conductive layer providing tracing attached to a first surface of the support substrate, lead beams in electrical communication with the tracing for attaching the flexible circuit to a micro-fluid ejection head, and a plasma polymerized layer deposited on at least a portion of the conductive layer to reduce corrosion of the conductive layer.

9. The micro-fluid ejection device structure of claim 8, wherein the plasma polymerized layer comprises a material derived from a monomer selected from the group consisting of polymerizable fluorocarbon monomers, polymerizable hydrocarbon monomers, polymerizable silicon containing monomers, polymerizable sulfur containing monomers, and mixtures of two or more of the foregoing.

10. The micro-fluid ejection device structure of claim 9, wherein the monomer is selected from the group consisting of hexamethyldisiloxane, tetraethoxysilane, hexamethyldisilazane, and mixtures of two or more of the foregoing.

11. The micro-fluid ejection device structure of claim 9, wherein the monomer is selected from the group consisting of carbon tetrafluoride, tetrafluoroethylene, hexafluoropropylene, heptafluorobutanol, pentafluorodimethyl ether, perfluoropropylene oxide, bis(trifluoromethyl)peroxide, heptafluorobutyric anhydride, x-hydroperfluoroisobutyric acid, (perfluoropropenyl-2)acetate, and trifluoroacetaldehyde.

12. The micro-fluid ejection device structure of claim 9, wherein the monomer is selected from a group consisting of sulfur hexafluoride, mercaptosilanes, benzothiazoles, mercaptobutanol and mixtures of two or more of the foregoing.

13. The micro-fluid ejection device structure of claim 8, wherein the conductive layer is comprised of a metal selected from the group consisting of copper and aluminum.

14. A method for improving corrosion resistance of a flexible circuit structure including a polymeric substrate having first and second surface and a conductive layer patterned and developed on the first surface of the substrate, comprising:
    plasma polymerizing a material onto at least the first surface and conductive layer of the flexible circuit to effectively coat the conductive layer with a corrosion resistant material derived from a monomer selected from the group consisting of, polymerizable fluorocarbon monomers, polymerizable hydrocarbon monomers, polymerizable silicon containing monomers, polymerizable sulfur containing monomers and mixtures of two or more of the foregoing.

15. The method of claim 14, wherein the monomer is selected from the group consisting of hexamethyldisiloxane, tetraethoxysilane, hexamethyldisilazane, and mixtures of two or more of the foregoing.

16. The method of claim 14, wherein the monomer is selected from the group consisting of carbon tetrafluoride, tetrafluoroethylene, hexafluoropropylene, heptafluorobutanol, pentafluorodimethyl ether, perfluoropropylene oxide, bis(trifluoromethyl) peroxide, heptafluorobutyric anhydride, x-hydroperfluoroisobutyric acid, (perfluoropropenyl-2)acetate, and trifluoroacetaldehyde.

17. The method of claim 14, wherein the monomer is selected from a group consisting of sulfur hexafluoride, mercaptosilanes, benzothiazoles, mercaptobutanol and mixtures of two or more of the foregoing.

18. The method of claim 14, wherein the conductive layer is comprised of a metal selected from the group consisting of copper and aluminum.

19. The method of claim 14, further comprising plasma polymerizing a material onto the second surface of the flexible circuit to effectively coat the second surface of the flexible circuit with a corrosion resistant material derived from a monomer selected from the group consisting of, polymerizable fluorocarbon monomers, polymerizable hydrocarbon monomers, polymerizable silicon containing monomers, polymerizable sulfur containing monomers and mixtures of two or more of the foregoing.

20. A method for enhancing adhesion between a flexible circuit and an adhesive or encapsulant material for constructing a micro-fluid ejection device structure, the flexible circuit including a polymeric substrate having first and second surface and a conductive layer patterned and developed on the first surface of the substrate, comprising:

plasma polymerizing a material onto the first and second surfaces of the flexible circuit to effectively coat the conductive layer and the first and second surfaces with a corrosion resistant material derived from a monomer selected from the group consisting of, polymerizable fluorocarbon monomers, polymerizable hydrocarbon monomers, polymerizable silicon containing monomers, polymerizable sulfur containing monomers and mixtures of two or more of the foregoing.

21. The method of claim 20, wherein the monomer is selected from the group consisting of hexamethyldisiloxane, tetraetoxysilane, hexamethyldisilazane, and mixtures of two or more of the foregoing.

22. The method of claim 20, wherein the monomer is selected from the group consisting of carbon tetrafluoride, tetrafluoroethylene, hexafluoropropylene, heptafluorobutanol, pentafluorodimethyl ether, perfluoropropylene oxide, bis(trifluoromethyl)peroxide, heptafluorobutyric anhydride, x-hydroperfluoroisobutyric acid, (perfluoropropenyl-2)acetate, and trifluoroacetaldehyde.

23. The method of claim 20, wherein the monomer is selected from a group consisting of sulfur hexafluoride, mercaptosilanes, benzothiazoles, mercaptobutanol and mixtures of two or more of the foregoing.

24. The method of claim 20, wherein the conductive layer is comprised of a metal selected from the group consisting of copper and aluminum.

* * * * *